United States Patent
Jeon et al.

[11] Patent Number: 6,118,722
[45] Date of Patent: *Sep. 12, 2000

[54] INTEGRATED CIRCUIT MEMORY DEVICE

[75] Inventors: Jun-young Jeon, Seoul; Gi-won Cha, Suwon; Sang-jae Lee, Seoul, all of Rep. of Korea

[73] Assignee: Samsung Electronics, Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/759,353

[22] Filed: Dec. 3, 1996

[30] Foreign Application Priority Data

Dec. 4, 1995 [KR] Rep. of Korea ............ 95-46459

[51] Int. Cl.[7] ............................................ G11C 8/00
[52] U.S. Cl. .................... 365/230.03; 365/230.06; 365/230.04
[58] Field of Search ............... 365/230.03, 230.04, 365/63, 72, 230.06

[56] References Cited

U.S. PATENT DOCUMENTS

| | | | |
|---|---|---|---|
| 4,982,372 | 1/1991 | Matsuo | 365/230.04 |
| 5,416,748 | 5/1995 | Fujita . | |
| 5,517,457 | 5/1996 | Sakui | 365/230.04 |
| 5,555,529 | 9/1996 | Hose | 365/230.04 |
| 5,625,590 | 4/1997 | Choi | 365/230.04 |

Primary Examiner—A. Zarabian

Attorney, Agent, or Firm—Marger Johnson & McCollom, P.C.

[57] ABSTRACT

An integrated circuit memory device includes a memory cell block including a memory cell array which has a plurality of odd and even numbered subword lines extending therethrough. A first decoder is disposed at a top side of the memory cell block, which receives a first row address and generate a plurality of first control signals in response thereto. A second decoder is disposed at a bottom side of the memory cell block, which receives the first row address and generate a plurality of second control signals in response thereto. A row decoder receives a second row address and generates a word line signal in response thereto. A first driver block including a first plurality of subword line drive circuits adjacent to the memory cell array wherein each of the subword line drive circuits of the first plurality is connected to a respective odd numbered subword line of the memory cell array, and wherein the first plurality of subword line drive circuits drive the respective odd numbered subword lines responsive to odd numbered control signals of the first and the second control signals and the word line signal. A second driver block including a second plurality of subword line drive circuits adjacent to the memory cell array opposite to the first driver block wherein each of the subword line drive circuits of the second plurality is connected to a respective even numbered subword line of the memory cell array, and wherein the second plurality of subword line drive circuits drive the respective even numbered subword lines responsive to even numbered control signals of the first and the second control signals and the word line signal.

33 Claims, 2 Drawing Sheets

INTEGRATED CIRCUIT MEMORY DEVICE

FIELD OF THE INVENTION

The present invention relates to a semiconductor memory device and, more particularly to an integrated circuit memory device having word line decoder drivers for at least four subword lines are provided at top and bottom sides of a memory cell block.

BACKGROUND OF THE INVENTION

On an integrated circuit memory device, the memory cells occupy the majority of the space (area), and the number of memory cells determines the memory capacity of the devices. The integration density of a memory device is thus determined in large part by the size of each memory cell. In a dynamic random access memory (DRAM), column and row decoders are provided to select specific memory cells in response to address signals. Accordingly, in dynamic random access memories having memory capacities of 64 MB to 256 MB or greater, the transistors making up the column and row decoders also become a factor making further integration difficult.

A single column decoder is required for a pair of two bit lines for a parallel test when a multi-bit test function is provided in a dynamic random access memory. Accordingly, the layout for a column decoder driver can be designed relatively easily. Two row decoders, however, may be required for every word line connected to respective memory cells. In addition, word line drive circuits drive word lines connected to memory cells in response to the outputs of row decoders. The layout of these word line drive circuits may thus act as a factor making higher degrees of integration more difficult to obtain.

Furthermore, the access time of a dynamic random access memory is determined in part by the time required to charge the word lines after the voltage on the corresponding decoder output line begins to rise. By reducing the time required to charge the word lines, the access time for the memory device can thus be reduced. To increase the integration of the memory device, however, it may be necessary to reduce the pitch of the word lines. As the integration density of a memory device is increased, however, the number of memory cells connected to each word line is increased and the word line drive circuit may be required to have a larger current driving capacity. More particularly, the transistors making up the word line drive circuit may be required to have a larger driving capacity thus increasing the area occupied by each of these transistors. Accordingly, increased integration may require that the area occupied by the drive circuits be reduced in a vertical dimension in a direction orthogonal to the word lines while providing a larger driving capacity for these drive circuits. Both of these requirements, however, may be difficult to achieve at once because larger areas are typically required for drive circuits having larger driving capacities.

To address these issues, a dynamic random access memory is discussed in U.S. Pat. No. 5,416,748 entitled "Semiconductor Memory Device Having Dual Word Line Structure" to Mamoru Fujita. An example of a DRAM having dual word line structure is illustrated in FIG. 1. As shown, the DRAM has a plurality of memory array blocks 100-1, 100-2, . . . , 100-n. Since each of the memory array blocks has the same construction as one another, only the memory array block 100-1 is shown in the drawing and will be explained in detail below.

The memory array block 100-1 includes a plurality of main word lines MWL-1 to MWL-n arranged in a plurality of rows and which are in turn connected to a row decoder 110. This decoder 110 responds to row address ADI and selects and drives one of the main word lines MWL to an active high level. Provided between the adjacent two main word lines MWL1 and MWL2 are subword line drivers (SWD) 130. Each of the subword line drivers 130 has an input node connected to an associated one of the main word lines MWL, an output node connected to an associated subword line SWL and a control node.

The memory array block 100-1 further includes a plurality of word decoder drivers (WDD) 150-1, 150-2, and 150-3 provided correspondingly to each column of the subword line driver array. Each of the word decoder drivers (WDD) has a first power output node connected in common to the power nodes of the odd-numbered ones of the subword line drivers arranged in the same associated column, a second control output node connected in common to the control nodes of the even-numbered ones thereof. The word decoder driver further has first, second and third address input nodes.

The memory array block 100-1 further includes a word decoder (WD) 140 which responds to another row address ADII and changes its output nodes to the active high level.

In each memory array block, each of first, second and third memory cell arrays 120-1, 120-2 and 120-3 is provided to the right side of each subword line driver group, and each of the word lines MWL1 and MWL2 is split into two subword lines extending through each memory cell arrays 120-1, 120-2 and 120-3. The subword line drivers SWD drive the subword lines SWL0 and SWL1 in the memory cell arrays.

When at least one of the main word lines MWL1–MWLn is activated by a selection signal generated from the row decoder 110, the subword line drivers are enabled by the activated word line MWL as the word line is raised to a fixed voltage potential as a boosting voltage potential. All of the subword line drivers, however, are not selected. In particular, at least one of the subword line drivers which has been enabled may be selected by a logic combination of driving signals ΦX1 and ΦX2 generated from a corresponding word decoder driver. Accordingly, at least one of the subword lines SWL0 and SWL1 can be raised to the fixed voltage potential as a boosting voltage potential by means of the selected subword line drive circuits.

In the memory device having the above construction, the reduction in the size of the respective subword line drivers may however be limited even though the degree of integration is increased. Furthermore, this configuration may require that the pitch of the subword lines be determined by the size of the corresponding subword line driver. Accordingly, even if the degree of integration is increased using the split word line configuration discussed above, the pitch of the main word lines and the pitch of the subword lines may not be sufficiently reduced. As a result, the conventional split word line drive configuration may be insufficient for integrated circuit memory devices having higher levels of integration.

Accordingly, there continues to exists a need in the art for integrated circuit memory devices including improved word line drive circuits.

SUMMARY OF THE INVENTION

It is therefore an object of the present invention to provide improved integrated circuit memory devices.

It is another object of the present invention to provide integrated circuit memory devices having the capacity for higher levels of integration.

It is a further object of the present invention to provide integrated circuit memory devices in which at least four subword lines may be arranged with respect to a single main word line.

It is another object of the present invention to provide integrated circuit memory devices in which word line decoder drivers for subword lines are provided at top and bottom sides of each memory cell block.

These and other objects are provided according to the present invention including a memory cell block including a memory cell array which has a plurality of odd and even numbered subword lines extending through the memory cell array, first decoding means disposed at a top side of the memory cell block, which receives a first row address and generate a plurality of first driving signals in response thereto, and second decoding means disposed at a bottom side of the memory cell block, which receives the first row address and generate a plurality of second driving signals in response thereto. A row decoder which receives a second row address and generates a word line signal in response thereto. A first driver block including a first plurality of subword line drive circuits adjacent to the memory cell array and each of the subword line drive circuits of the first plurality is connected to a respective odd numbered subword line of the memory cell array. The first plurality of subword line drive circuits drive the respective odd numbered subword lines responsive to odd numbered driving signals of the first and the second driving signals and the word line signal. A second driver block including a second plurality of subword line drive circuits adjacent to the memory cell array opposite to the first driver block and each of the subword line drive circuits of the second plurality is connected to a respective even numbered subword line of the memory cell array. The second plurality of subword line drive circuits drive the respective even numbered subword lines responsive to even numbered driving signals of the first and the second driving signals and the word line signal.

This arrangement allows the subword line drive circuits to extend in a vertical direction orthogonal to the word line thereby providing increased integration densities. Stated in other words, the drive circuit for each subword line can occupy space in a vertical dimension provided for multiple subword lines.

More particularly, the memory cell array includes first, second, third, and fourth subword lines. In this case, the first driver block includes a first subword line drive circuit connected to the first subword line and a second subword line drive circuit connected to the third subword line. Also, the second driver block includes a first subword line drive circuit connected to the second subword line and a second subword line drive circuit connected to the fourth subword line. With this arrangement, the word line drive circuit for each word line can occupy four times the pitch of the word lines in the vertical dimension.

With the configuration including four subword lines, the first decoder generates first and second decoding signals responsive to the received row address. The second decoder generates third and fourth decoding signals in response to the received address, the first and second subword line drive circuits of the first driver block are respectively in response to the first and third decoding signals, and the first and second subword line drive circuits of the second driver block are respectively responsive to the second and forth decoding signals.

According to another aspect of the present invention, an integrated circuit memory device includes a memory cell block including first and second memory cell arrays. A first decoder is disposed at a top side of the memory cell block. The first decoder receives a first row address and generates respectively first, second, and third driving signals in response thereto. A second decoder is disposed at a bottom side of the memory cell block. The second decoder receives the first row address and generates respective fourth, fifth, and sixth driving signals in response thereto, and at least one main word line. A first plurality of subword lines corresponding to the at least one main word line. Each of the subword lines of the first plurality extends through the first memory cell array. A second plurality of subword lines corresponding to the at least one main word line, and each of the subword lines of the second plurality extends through the second memory cell array. A first driver block including a first plurality of subword line drive circuits disposed between the first and second memory cell arrays and a first and a second subword line drive circuits of the first driver block are respectively connected to second and fourth subword lines of each of the first and second memory cell arrays. The first subword line drive circuit drives the second subword lines of the first and second memory cell arrays responsive to the second driving signals and a signal on the at least one main word line, and the second subword line drive circuit drives the fourth subword lines of the first and second memory cell arrays responsive to the fifth driving signal and a signal on the at least one main word line. A second driver block including a second plurality of subword line drive circuits disposed adjacent to the first memory cell array opposite to the first driver block and a first and a second subword line drive circuits of the second driver block are respectively connected to first and third subword lines of the first memory cell array. The first subword line drive circuit drives the first subword line of the first memory cell array responsive to the first driving signal and the signal on the main word line. The second subword line drive circuit drives the fourth subword line of the first memory cell array responsive to the fourth driving signal and a signal on the at least one main word line. A third driver block including a third plurality of subword line drive circuits disposed adjacent to the second memory cell array opposite to the first driver block, a first and a second subword line drive circuits of the third driver block are respectively connected to first and third subword lines of the second memory cell array. The first subword line drive circuit drives the first subword line of the second memory cell array responsive to the third driving signal and the signal on the at least one main word line. The second subword line drive circuit drives the third subword line of the second memory cell array responsive to the sixth driving signal and a signal on the at least one main word line.

The integrated circuit memory devices of the present invention thus allow higher levels of integration density to be achieved thus allowing increased memory capacity.

DETAILED DESCRIPTION OF THE PREFERRED EMBODIMENT

The present invention will now be described more fully hereinafter with reference to the accompanying drawings, in which a preferred embodiment of the invention is shown. This invention may, however, be embodied in many different forms and should not be constructed as limited to the embodiment set forth herein; rather, this embodiment is provided so that this disclosure will be thorough and complete, and will fully convey the scope of the invention to those skilled in the art. Like numbers refer to like elements throughout.

Figure 1:
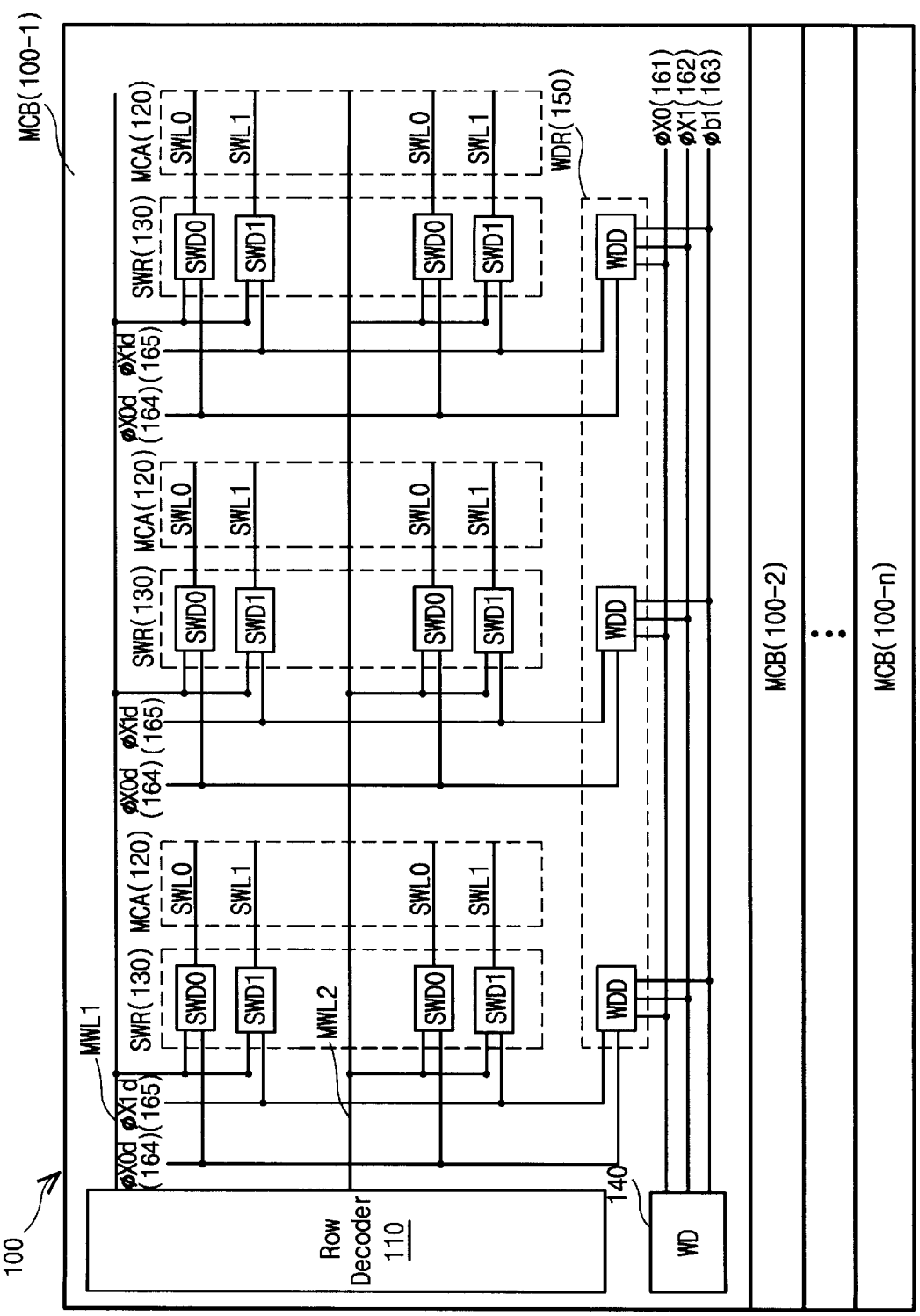
FIG. 1 illustrates a layout for a dynamic random access memory (DRAM) according to the prior art.
Figure 2:
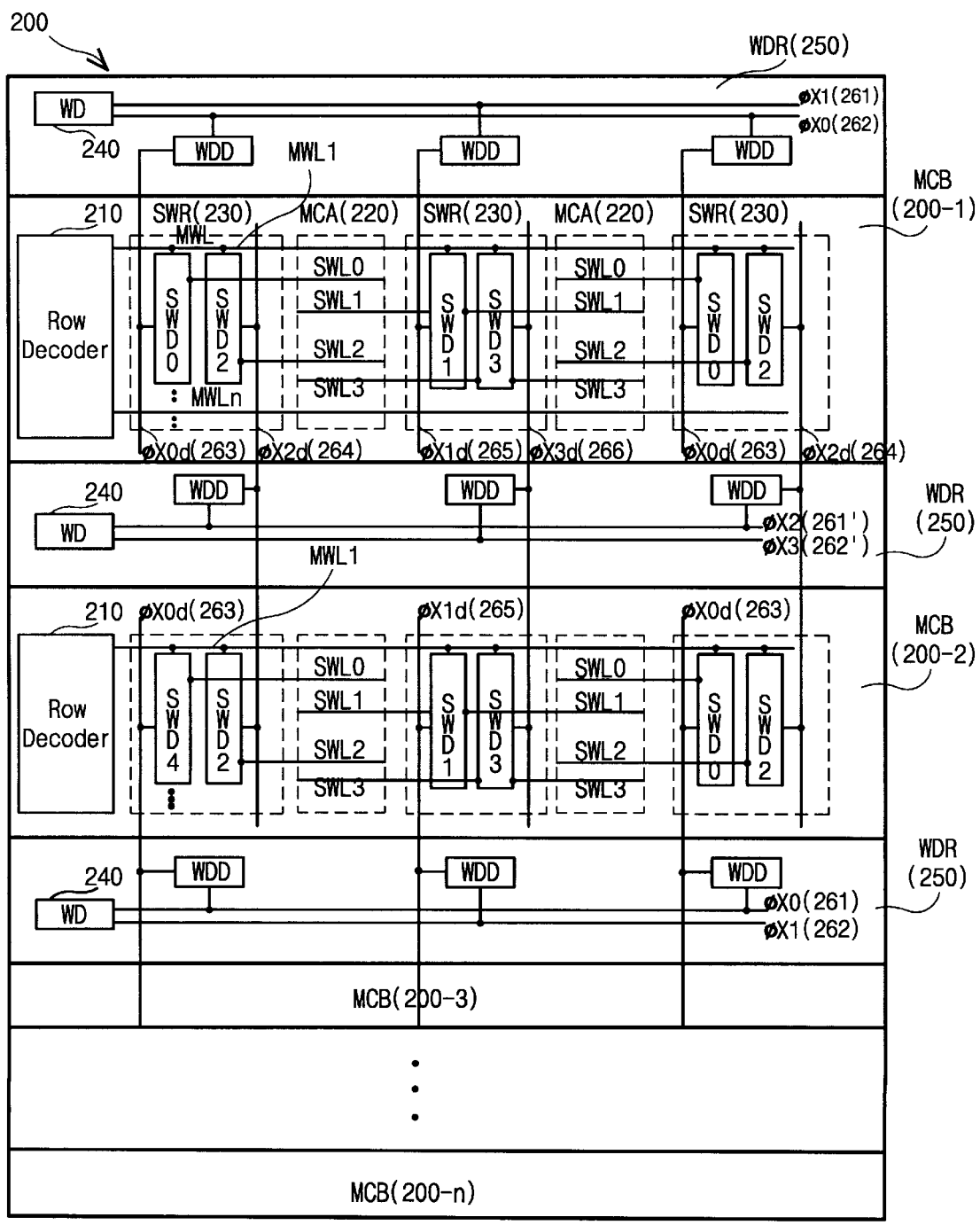
FIG. 2 illustrates a layout for a dynamic random access memory (DRAM) according to an aspect of the present invention.

An integrated circuit memory device according to the present invention is illustrated in FIG. 2. As shown, the memory device has a plurality of memory cell blocks 200-1, 200-2, 200-3, . . . , and 200-n. Each of the memory cell blocks has a row decoder 210 which decodes row address signals ADI, memory cell arrays 220 and 222 which are arranged in a direction orthogonal with respect to bit lines, and subword line driver circuits SWD1–SWD6. The first and second memory cell arrays 220 and 222 are disposed to the left and right, and subword line drive circuits are provided in the first, second, and third driver blocks 230-1, 230-2, and 230-3. The first driver block 230-1 is provided adjacent to the first memory cell array 220 opposite to the second driver block 230-2. The second driver block 230-2 is provided between the first and second memory cell arrays 220 and 222. The third driver block 230-3 is provided adjacent to the second memory cell array 222 opposite to the second driver block 230-2. The subword line driver circuits SWD1–SWD6 provided in the respective driver blocks are selectively activated in response to driving signals ΦX1, ΦX2, ΦX3, ΦX4, ΦX5, and ΦX6. These driving signals are generated by word line decoder drivers WDD1–WDD6 which decode decoding signals ΦD1, ΦD2, ΦD3 and ΦD4 from word line decoders 240-1 and 240-2. The word line decoders are respectively provided at both top and bottom sides of the memory cell block 200-1. The word line decoders decode row address signals ADII and generate the decoding signals ΦD1, ΦD2, ΦD3 and ΦD4. The word line decoder 240-1 and the word line decoder drivers WDD1–WDD3 are disposed at the top side of the memory cell block 200-1 and the word line decoder 240-2 and the word line decoder drivers WDD4–WDD6 are disposed at the bottom side of the memory cell block 200-1.

In addition, a first plurality of bit lines extends through the first memory cell array 220, and a second plurality of bit lines extends through the second memory cell array 222. The subword line drive circuits SWD1 and SWD2 of the first driver block 230-1 are disposed in parallel with respect to each other and in a direction orthogonal with respect to the main word line MWL. The subword line drive circuits SWD3 and SWD4 of the second driver block 230-2 are disposed in parallel with respect to each other and in the direction orthogonal with respect to the word line MWL. The subword line drive circuits SWD5 and SWD6 of the third driver block 230-3 are disposed in parallel with respect to each other, and in the direction orthogonal with respect to the main word line MWL.

In the first and the third driver block 230-1 and 230-3, the main word line MWL is split into two subword lines SWL1 and SWL3 for each memory cell array through the subword line drive circuits SWD1, SWD2, SWD5, and SWD6. In addition, the main word line is split into two subword lines SWL2 and SWL4 by the subword line drive circuits SWD3 and SWD4 of the second driver block 230-2.

As shown again FIG. 2, the subword line drive circuits SWD3 and SWD4 of the second driver block 230-2 are provided in parallel between the first and the second memory cell arrays 220 and 222. The subword line drive circuits SWD1 and SWD2 of the first driver block 230-1 are disposed in parallel adjacent to the first memory cell array 220 opposite to the second driver block 230-2. The subword line drive circuits SWD5 and SWD6 of the third driver block 230-3 are disposed in parallel adjacent to the second memory cell array 222 opposite to the second block 230-2. In other words, the subword line drive circuits SWD1–SWD6 for the respective subword lines are disposed between adjacent main word lines and in the direction of the bit lines. In this example, the subword line drive circuits include word line drive transistors which can be MOS transistors.

More specifically, the even numbered subword lines SWL2 and SWL4 of the first and the second memory cell arrays 220 and 222 each extend to the second driver blocks 230-2 and are commonly connected to the subword line drive circuits SWD3 and SWD4, respectively, as shown. In other words, the subword lines SWL2 of the memory cell arrays 220 and 222 are commonly connected to the subword line drive circuit SWD3 of the second driver block 230-2, and the subword lines SWL4 of the arrays 220 and 222 are commonly connected to the subword line drive circuit SWD4 of the second driver block 230-2.

The odd numbered word lines SWL1 and SWL3 of the first memory cell array 220 are respectively connected to the subword line drive circuits SWD1 and SWD2 of the first driver block 230-1. As shown, the subword line SWL3 of the first memory cell array 220 is provided between the even numbered word lines SWL2 and SWL4 and is connected to the subword line drive circuit SWD2 of the first driver block 230-1. The subword line SWL1 of the first memory cell array 220 is provided above the even numbered subword line SWL2 and is connected to the subword line drive circuit SWD1 of the first driver block 230-1.

The second memory cell array 222 also includes odd numbered subword lines SWL1 and SWL3 and each of these subword lines extends to the third driver block 230-3. In particular, the subword line SWL3 is connected to the subword line drive circuit SWD6, and this subword line is provided between the even numbered subword lines SWL2 and SWL4. The subword line SWL1 of the second memory cell array 222 is provided above the even numbered subword line SWL2 and is connected to the subword line drive circuit SWD5 of the third driver block 230-3.

As shown in FIG. 2, the memory cell block 200-1 is disposed between word line driver regions 250-1 and 250-2 at the top and the bottom sides thereof. Each of these word line driver regions has one word line decoder and a plurality of word line decoder drivers corresponding to the number of subword line driver blocks.

In the word line driver region 250-1 at the top side of the memory cell block 200-1, the word line decoder 240-1 decodes row address signals ADII and generates the decoding signals ΦD1 and ΦD2. The word line decoder drivers WDD1 and WDD3 drive the subword line drive circuits SWD1 and SWD5 in response to the decoding signal ΦD1, respectively. The word line decoder driver WDD2 drives the subword line drive circuit SWD3 in response to the decoding signal ΦD2.

In the word line driver region 250-2 at the bottom side of the memory cell block 200-1, the word line decoder 240-2 decodes row address row address signals ADII and generates the decoding signals ΦD3 and ΦD4. The word line decoder drivers WDD4 and WDD6 drive the subword line drive circuits SWD2 and SWD6 in response to the decoding signal ΦD3, respectively. The word line decoder driver WDD5 drives the subword line drive circuit SWD4 in response to the decoding signal ΦD4. In addition, the word line driver region 250-2 serves as a top word line driver region of a second memory cell block 200-2 next to the first memory cell block 200-1. As shown, the word line decoder 240-2 decodes row address signals ADII and generates the decoding signals ΦD3 and ΦD4. The word line decoder drivers WDD4 and WDD6 drive the subword line drive circuits SWD2 and SWD6 of the second memory cell block 200-2 in response to the decoding signal ΦD3, respectively. The word line decoder driver WDD5 drives the subword line drive circuit SWD4 of the second memory cell block 200-2 in response to the decoding signal ΦD4.

Memory cells of each memory cell array are disposed at intersections of the subword lines and bit lines. If the folded-bit memory configuration is used, memory cells may not be disposed at every intersection. Instead, dummy cells can be connected to the respective bit lines to provide a reference voltage Vcc/2. As shown in FIG. 2, the row decoder 210 decodes the row address ADI, and selectively enables the main word line MWL to be at a high level in response to the row address ADI.

The operation of an integrated circuit memory device including split word lines according to the present invention will now be described with reference to FIG. 2. For the purposes of this discussion, it will be assumed that each memory cells are of the one-transistor type including a charge storage capacitor connected to a fixed potential and a transfer gate such as a MOS transistor connected between the capacitor and the bit line. As will be understood by one having skill in the art, the transfer gate transfers a charge from the storage capacitor to the bit line.

When data is to be read from a memory cell, a row address ADI is decoded by the row decoder 210, and a main word line corresponding to the address is selected. While the row decoder 210 of FIG. 2 is shown having a single main word line MWL, one having skill in the art will understood that multiple word lines can be provided. In response to the row address, the main word line MWL corresponding to the row address is activated. The subword line drive circuits of the driver blocks are enabled by the activated word line MWL as the word line is raised to a fixed voltage potential. All of the drive circuits, however, are not selected. In particular, at least one of the subword line drive circuits which has been enabled may be selected by a logic combination of the driving signals ΦX1–ΦX6. These driving signals are generated by word line decoder drivers WDD1–WDD6 of the word line decoders 240-1 and 240-2 in response to the decoding signals ΦD1, ΦD2, ΦD3 and ΦD4 generated from word line decoders 240-1 and 240-2. Accordingly, at least one of the subword lines SWL1–SWL4 can be raised to the fixed voltage potential by means of the selected subword line drive circuits. Assuming that subword lines are raised to the fixed voltage potential during read operations, data stored on the capacitors of the selected memory cells connected to the selected subword lines are transferred to the respective bit lines.

For example, to permit the subword lines SWL1 to be raised to the fixed voltage potential, the subword line drive circuits SWD1 and SWD5 connected to the main word line MWL are selected by the driving signals ΦX1 and ΦX5. To select the subword lines SWL2 of the first and the second memory cell arrays, the subword line drive circuit SWD3 is selected by the driving signal ΦX3, thus raising the subword lines SWL2 to the fixed voltage potential. To select the subword lines SWL4 of the first and the second memory cell arrays, the subword line drive circuit SWD4 is selected by the driving signal ΦX4 thus raising the subword lines SWL4 to the fixed voltage potential. The subword lines SWL1 of the memory cell arrays can be activated by the subword line drive circuits SWD1 and SWD5 in response to the driving signal ΦX1 and ΦX5. The subword lines SWL3 can be activated by the subword line drive circuits SWD2 and SWD6 in response to the driving signals ΦX2 and ΦX6.

In the configuration described above, the subword line drive circuits are divided into three blocks 230-1, 230-2 and 230-3. The first driver block 230-1 is positioned to the left of the first memory cell array 220, the second driver block 230-2 is positioned between the memory cell arrays 220 and 222, and the third driver block 230-3 is positioned to the right of the second memory cell array 222. Each of the driver blocks has two subword line drive circuits which are disposed in parallel with each other and in the direction of the bit line. The subword line drive circuits SWD1 and SWD2 are respectively provided to drive the odd numbered subword lines SWL1 and SWL3 of the first memory cell array 220. Further, the subword line drive circuits SWD5 and SWD6 are respectively provided to drive the odd numbered subword lines SWL1 and SWL3 of the second memory cell array 222. The subword line drive circuits SWD3 and SWD4 are respectively provided to drive the even numbered subword lines SWL2 and SWL4 of each of the memory cell arrays 220 and 222. The drive circuit for each subword line can thus occupy space in the vertical extension occupied by four subword lines. That is, the drive circuit for each subword line can have four times the pitch of the subword line. In other words, the vertical dimension of the area which each drive circuit can occupy is four times the pitch of the subword lines. The size of the subword line drive circuit can thus be increased and/or the pitch of the subword lines can be reduced. Accordingly, the degree of integration can be increased without decreasing the memory cell size.

Furthermore, because word line decoder drivers for subword lines are divided at top and bottom sides of each memory cell block in the memory device, the invention can minimize an area which is occupied by the word line decoder drivers. As a result, the further degree of integration can be obtained.

What is claimed is:

1. An integrated circuit memory device comprising:
    a memory cell block including a memory cell array which has a plurality of odd and even numbered subword lines extending through said memory cell array;
    first word line decoding means disposed at a top side of said memory cell block, which receives a first row address and generates a plurality of first driving signals in response thereto;
    second word line decoding means disposed at a bottom side of said memory cell block, which receives said first row address and generates a plurality of second driving signals in response thereto;
    a row decoder which receives a second row address and generates a word line signal in response thereto;
    a first driver block including a first plurality of subword line drive circuits adjacent to said memory cell array, wherein each of said subword line drive circuits of said first plurality is connected to a respective odd numbered subword line of said memory cell array, and wherein said first plurality of subword line drive circuits drive said respective odd numbered subword lines responsive to odd numbered driving signals of said first and said second driving signals and said word line signal; and
    a second driver block including a second plurality of subword line drive circuits adjacent to said memory cell array opposite to said first driver block, wherein each of said subword line drive circuits of said second plurality is connected to a respective even numbered subword line of said memory cell array, and wherein said second plurality of subword line drive circuits drive said respective even numbered subword lines responsive to even numbered driving signals of the first and the second driving signals and said word line signal.

2. An integrated circuit memory device according to claim 1 wherein said memory cell array includes first, second, third, and fourth subword lines, wherein said first driver block includes a first subword line drive circuit connected to said first subword line and a second subword line drive circuit connected to said third subword line, and wherein said second driver block includes a first subword line drive circuit connected to said second subword line and a second subword line drive circuit connected to said fourth subword line.

3. An integrated circuit memory device according to claim 1 wherein said first word line decoding means generates first and second decoding signals responsive to said first row address, wherein said second word line decoding means generates third and fourth decoding signals in response to said received row address, wherein said first and second subword line drive circuits of said first driver block are respectively responsive to said first and third decoding signals, and wherein said first and second subword line drive circuits of said second driver block are respectively responsive to said second and fourth decoding signals.

4. An integrated circuit memory device according to claim 1 wherein said even and odd numbered subword lines of said memory cell array are parallel with said even numbered subword lines being interleaved between said odd numbered subword lines.

5. An integrated circuit memory device according to claim 1 further comprising:
a second memory cell array adjacent to said second driver block opposite to said memory cell array, wherein said second memory cell array includes a second plurality of odd and even numbered subword lines extending through said second memory cell array, wherein each of said subword line drive circuits of said second plurality is connected to a respective even numbered subword line of said second memory cell array, and wherein said second plurality of subword line drive circuits drive said respective even numbered subword lines of said second memory cell array responsive to said even numbered control signals and said word line signal; and
a third driver block including a third plurality of subword line drive circuits adjacent to said second memory cell array opposite to said second driver block wherein each of said subword line drive circuits of said third plurality is connected to a respective odd numbered subword line of said second memory cell array, and wherein said third plurality of subword line drive circuits drive said respective odd numbered subword lines responsive to said odd numbered control signals and said word line signal.

6. An integrated circuit memory device according to claim 1 wherein a plurality of memory cells of said memory cell array is connected to a responsive one of said subword lines.

7. An integrated circuit memory device according to claim 1 wherein said subword lines of said memory cell array are connected through respective subword line drive circuits to a common fixed electrical potential as a boosting voltage potential.

8. An integrated circuit memory device according to claim 1 wherein said first and second pluralities of said subword line drive circuits are disposed in parallel with respect to each other and in a direction orthogonal with respect to at least one main word line.

9. An integrated circuit memory device according to claim 1 further comprising:
a first plurality of bit lines extending through said memory cell array.

10. An integrated circuit memory device comprising:
a memory cell block including first and second memory cell arrays;
first decoding means disposed at a top side of said memory cell block, which receives a first row address and generates respective first, second and third control signals in response thereto;
second decoding means disposed at a bottom side of said memory cell block, which receives said first row address and generates respective fourth, fifth, and sixth control signals in response thereto;
at least one main word line; a first plurality of subword lines corresponding to said at least one main word line, wherein each of said subword lines of said first plurality extends through said first memory cell array;
a second plurality of subword lines corresponding to said at least one main word line, wherein each of said subword lines of said second plurality extends through said second memory cell array;
a first driver block including a first plurality of drive circuits disposed between said first and second memory cell arrays, wherein a first and a second subword line drive circuits of said first driver block are respectively connected to second and fourth subword lines of each of said first and second memory cell arrays, wherein said first subword line drive circuit drives said second subword lines of said first and second memory cell arrays responsive to said second control signal and a signal on said at least one main word line, and wherein said second subword line drive circuit drives said fourth subword lines of said first and second memory cell arrays responsive to said fifth control signal and a signal on said at least one main word line;
a second driver block including a second plurality of drive circuits disposed adjacent to said first memory cell array opposite to said first driver block, wherein a first and a second subword line drive circuits of said second driver block are respectively connected to first and third subword lines of said first memory cell array, wherein said first subword line drive circuit drives said first subword line of said first memory cell array responsive to said first control signal and said signal on said main word line, and wherein said second subword line drive circuit drives said third subword line of said first memory cell array responsive to said fourth control signal and a signal on said at least one main word line; and
a third driver block including a third plurality of drive circuits disposed adjacent to said second memory cell array opposite to said first driver block, wherein a first and a second subword line drive circuits of said third driver block are respectively connected to first and third subword lines of said second memory cell array, and wherein said first subword line drive circuit drives said first subword line of said second memory cell array responsive to said third control signal and said signal on said at least one main word line, and wherein said second subword line drive circuit drives said third subword line of said second memory cell array responsive to said sixth control signal and a signal on said at least one main word line.

11. An integrated circuit memory device according to claim 10 wherein a plurality of memory cells within each of said memory cell arrays is connected to a responsive one of said subword lines.

12. An integrated circuit memory device according to claim 10 wherein said subword lines of one of said first and second memory cell arrays are connected through responsive subword line drive circuits to a common fixed electrical potential as a boosting voltage potential.

13. An integrated circuit memory device according to claim 10 wherein said first and second subword line drive circuits of each of said driver blocks are disposed in parallel with respect to each other and in a direction orthogonal with respect to said at least one main word line.

14. An integrated circuit memory device according to claim 10 further comprising:
   a first plurality of bit lines extending through said first memory cell array; and
   a second plurality of bit lines extending through said second memory cell array.

15. An integrated circuit memory device comprising:
   a first memory block including a first memory cell array which has a plurality of subword lines extending through said first memory cell array in a row direction;
   a second memory block including a second memory cell array which has a plurality of subword lines extending through said second memory cell array in said row direction;
   a first row decoder for generating a first word line signal in response to a first row address;
   a second row decoder for generating a second word line signal in response to said first row address;
   a first driver block in said first memory block for driving first ones of said subword lines of said plurality of said first memory cell array in response to a first driving signal and said first word line signal;
   a second driver block in said second memory block for driving first ones of said subword lines of said plurality of said second memory cell array in response to said first driving signal and said second word line signal; and
   first decoding means disposed between, and adjacent to, said first and second memory blocks, wherein said first decoding means responds to a second row address to generate said first driving signal which is commonly used in said first and second driver blocks.

16. The integrated circuit memory device according to claim 15, further comprising second decoding means disposed at a top side of said first memory block, for generating a second driving signal in response to said second row address, wherein said first driver block drives second ones of said plurality of subword lines of said first memory cell array in response to said second driving signal and said first word line signal.

17. An integrated circuit memory device comprising:
   a first memory block including a first memory cell array which has a plurality of subword lines extending through said first memory cell array in a row direction;
   a second memory block including a second memory cell array which has a plurality of subword lines extending through said second memory cell array in said row direction;
   a first row decoder for generating a first word line signal in response to a first row address;
   a second row decoder for generating a second word line signal in response to said first row address;
   a first driver block for driving first ones of said subword lines of said plurality of said first memory cell array in response to a first driving signal and said first word line signal;
   a second driver block for driving first ones of said subword lines of said plurality of said second memory cell array in response to said first driving signal and said second word line signal;
   first decoding means disposed between said first and second memory blocks, wherein said first decoding means responds to a second row address to generate said first driving signal which is commonly used in said first and second driver blocks;
   second decoding means disposed at a top side of said first memory block, for generating a second driving signal in response to said second row address, wherein said first driver block drives second ones of said plurality of subword lines of said first memory cell array in response to said second driving signal and said first word line signal; and
   a third driver block, wherein said first driver block includes a first plurality of subword line drive circuits adjacent to said first memory cell array, and said third driver block includes a second plurality of subword line drive circuits adjacent to said first memory cell array opposite said first plurality of subword line drive circuits,
   wherein said first driver signal is one of a first plurality of driver signals generated by said first decoding means, and said second driver signal is one of a second plurality of driver signals generated by said second decoding means,
   wherein each of said subword line drive circuits of said first plurality is connected to a respective odd numbered one of said subword lines of said plurality of said first memory cell array; wherein said first plurality of subword line drive circuits drive said respective odd numbered subword lines of said first memory cell array in response to odd numbered ones of said first and second pluralities of driving signals and said first word line signal; wherein each of said subword line drive circuits of said second plurality is connected to a respective even numbered one of said subword lines of said plurality of said first memory cell array; and wherein said second plurality of subword line drive circuits drive said respective even numbered subword lines of said first memory cell array in response to even numbered ones of said first and second pluralities of driving signals and said first word line signal.

18. The integrated circuit memory device according to claim 17, wherein said first memory cell array includes first, second, third and fourth subword lines; wherein said first driver block includes a first subword line drive circuit connected to said first subword line, and a second subword line drive circuit connected to said third subword line, and said third driver block includes a third subword line drive circuit connected to said second subword line, and a fourth subword line drive circuit connected to said fourth subword line; and wherein said first plurality of subword line drive circuits includes said first and second subword line drive circuits and said second plurality of subword line drive circuits includes said third and fourth subword line drive circuits.

19. The integrated circuit memory device according to claim 18, wherein said first decoding means generates first and second decoding signals in response to said second row address; wherein said second decoding means generates third and fourth decoding signals in response to said second row address; wherein said first and second subword line drive circuits are operated in response to said first and third decoding signals, respectively, and wherein said third and fourth subword line drive circuits are operated in response to said second and fourth decoding circuits, respectively.

20. The integrated circuit memory device according to claim 19, wherein said first memory block further comprises:

a third memory cell array adjacent to said second plurality of subword line drive circuits opposite said first memory cell array, wherein said third memory cell array includes a plurality of subword lines extending through said third memory cell array in said row direction, wherein each of said subword line drive circuits of said second plurality is connected to a respective even numbered subword line of said third memory cell array, and wherein second plurality of subword line drive circuits drive said respective even numbered subword lines of said third memory cell array in response to said even numbered ones of said first and second pluralities of driving signals and said first word line signal; and a third plurality of subword line drive circuits adjacent to said third memory cell array opposite said second plurality of subword line drive circuits, wherein each of said subword line drive circuits of said third plurality is connected to a respective odd numbered subword line of said third memory cell array; and wherein said third plurality of subword line drive circuits drive said respective odd numbered subword lines in response to said odd numbered ones of said first and second pluralities of driving signals and said first word line signal.

21. The integrated circuit memory device according to claim 20, wherein said odd numbered subword lines of said first and third memory cell arrays are parallel with said even numbered subword lines being interleaved between said odd numbered subword lines.

22. The integrated circuit memory device according to claim 21, wherein said subword lines of said first and third memory cell arrays are connected through corresponding subword line drive circuits to a common fixed electrical potential.

23. An integrated circuit memory device according to claim 22, wherein said first, second and third pluralities of said subword line drive circuits are disposed in parallel with respect to each other and in a direction orthogonal with respect to at least one main word line.

24. The integrated circuit memory device according to claim 16, further comprising third decoding means disposed at a bottom side of said second memory block, for generating a third driving signal in response to said second row address, wherein said second driver block drives second ones of said subword lines of said plurality of said second memory cell array in response to said third driving signal.

25. An integrated circuit memory device comprising:

a first memory block including a first memory cell array which has a plurality of subword lines extending through said first memory cell array in a row direction;

a second memory block including a second memory cell array which has a plurality of subword lines extending through said second memory cell array in said row direction;

a first row decoder for generating a first word line signal in response to a first row address;

a second row decoder for generating a second word line signal in response to said first row address;

a first driver block for driving first ones of said subword lines of said plurality of said first memory cell array in response to a first driving signal and said first word line signal;

a second driver block for driving first ones of said subword lines of said plurality of said second memory cell array in response to said first driving signal and said second word line signal;

first decoding means disposed between said first and second memory blocks, wherein said first decoding means responds to a second row address to generate said first driving signal which is commonly used in said first and second driver blocks;

second decoding means disposed at a top side of said first memory block, for generating a second driving signal in response to said second row address, wherein said first driver block drives second ones of said plurality of subword lines of said first memory cell array in response to said second driving signal and said first word line signal;

third decoding means disposed at a bottom side of said second memory block, for generating a third driving signal in response to said second row address, wherein said second driver block drives second ones of said subword lines of said plurality of said second memory cell array in response to said third driving signal; and a third driver block, wherein said second driver block includes a first plurality of subword line drive circuits adjacent to said second memory cell array, and said third driver block includes a second plurality of subword line drive circuits adjacent to said second memory cell array opposite said first plurality of subword line drive circuits, wherein said first driver signal is one of a first plurality of driver signals generated by said first decoding means, and said third driver signal is one of a third plurality of driver signals generated by said third decoding means, wherein each of said subword line drive circuits of said first plurality is connected to a respective odd numbered one of said subword lines of said plurality of said second memory cell array; wherein said first plurality of subword line drive circuits drive said respective odd numbered subword lines of said second memory cell array in response to odd numbered ones of said first and third pluralities of driving signals and said second word line signal; wherein each of said subword line drive circuits of said second plurality is connected to a respective even numbered one of said subword lines of said plurality of said second memory cell array; and wherein said second plurality of subword line drive circuits drive said respective even numbered subword lines of said second memory cell array in response to even numbered ones of said first and third pluralities of driving signals and said second word line signal.

26. The integrated circuit memory device according to claim 25, wherein said second memory cell array includes first, second, third and fourth subword lines; wherein said second driver block includes a first subword line drive circuit connected to said first subword line, and a second subword line drive circuit connected to said third subword line, and said third driver block includes a third subword line drive circuit connected to said second subword line, and a fourth subword line drive circuit connected to said fourth subword line; and wherein said first plurality of subword line drive circuits includes said first and second subword line drive circuits and said second plurality of subword line drive circuits includes said third and fourth subword line drive circuits.

27. The integrated circuit memory device according to claim 26, wherein said first decoding means generates first and second decoding signals in response to said second row address; wherein said third decoding means generates third and fourth decoding signals in response to said second row address; wherein said first and second subword line drive circuits are operated in response to said first and third decoding signals, respectively, and wherein said third and fourth subword line drive circuits are operated in response to said second and fourth decoding signals, respectively.

28. The integrated circuit memory device according to claim 27, wherein said second memory block further comprises:

a third memory cell array adjacent to said second plurality of subword line drive circuits opposite said second memory cell array, wherein said third memory cell array includes a plurality of subword lines extending through said third memory cell array in said row direction, wherein each of said subword line drive circuits of said second plurality is connected to a respective even numbered subword line of said third memory cell array, and wherein said second plurality of subword line drive circuits drive said respective even numbered subword lines of said third memory cell array in response to said even numbered ones of said first and third pluralities of driving signals and said second word line signal; and a third plurality of subword line drive circuits adjacent to said third memory cell array opposite said second plurality of subword line drive circuits, wherein each of said subword line drive circuits of said third plurality is connected to a respective odd numbered subword line of said third memory cell array; and wherein said third plurality of subword line drive circuits drive said respective odd numbered subword lines in response to said odd numbered ones of said first and third pluralities of driving signals and said second word line signal.

29. The integrated circuit memory device according to claim 28, wherein said odd numbered subword lines of said second and third memory cell arrays are parallel with said even numbered subword lines being interleaved between said odd numbered subword lines.

30. The integrated circuit memory device according to claim 29, wherein said subword lines of said second and third memory cell arrays are connected through corresponding subword line drive circuits to a common fixed electrical potential.

31. The integrated circuit memory device according to claim 30, wherein said first, second and third pluralities of said subword line drive circuits are disposed in parallel with respect to each other and in a direction orthogonal with respect to at least one main word line.

32. An integrated circuit memory device comprising:

a first memory block including a first memory cell array which has a plurality of subword lines extending through said first memory cell array in a row direction;

a first row decoder for generating a first word line signal in response to a first row address;

first decoding means disposed at a top side of said first memory block, for generating a first plurality of driving signals in response to a second row address;

second decoding means disposed at a bottom side of said first memory block, for generating a second plurality of driving signals in response to said second row address; and a first driver block for driving said subword lines of said first memory cell array in response to said first and second pluralities of driving signals and said first word line signal.

33. The integrated circuit memory device according to claim 32, further comprising:

a second memory block including a second memory cell array which has a plurality of subword lines extending through said second memory cell array in said row direction;

a second row decoder for generating a second word line signal in response to said first row address;

third decoding means disposed at a bottom side of said second memory block, for generating a third plurality of driving signals in response to said second row address; and a second driver block for driving said subword lines of said second memory cell array in response to said second and third pluralities of driving signals and said second word line signal.

* * * * *

UNITED STATES PATENT AND TRADEMARK OFFICE
CERTIFICATE OF CORRECTION

PATENT NO.    : 6,118,722
DATED         : September 12, 2000
INVENTOR(S)   : Jeon et al.

It is certified that error appears in the above-identified patent and that said Letters Patent is hereby corrected as shown below:

<u>Title page,</u>
Item [54], Title, "INTEGRATED CIRCUIT MEMORY DEVICE" should read
-- AN INTEGRATED CIRCUIT MEMORY DEVICE --.

<u>Column 2,</u>
Line 14, "first power" should read -- first control --.
Line 15, "power nodes" should read -- control nodes --.

<u>Column 10,</u>
Line 22, *insert a paragraph break after* "at least one main word line;".

Signed and Sealed this

Tenth Day of September, 2002

*Attest:*

JAMES E. ROGAN
*Attesting Officer*  *Director of the United States Patent and Trademark Office*